United States Patent
So et al.

(10) Patent No.: US 11,032,936 B2
(45) Date of Patent: Jun. 8, 2021

(54) INFORMATION PROCESSING DEVICE AND BOARD DEVICE

(71) Applicant: FUJITSU LIMITED, Kawasaki (JP)

(72) Inventors: Tsuyoshi So, Kawasaki (JP); Takaya Nakayama, Kawasaki (JP); Jiro Tsujimura, Kawasaki (JP); Yuki Kanai, Kawasaki (JP); Yoichi Sato, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/671,943

(22) Filed: Nov. 1, 2019

(65) Prior Publication Data

US 2020/0163249 A1     May 21, 2020

(30) Foreign Application Priority Data

Nov. 20, 2018   (JP) .............................. JP2018-217700

(51) Int. Cl.
*H05K 7/20*      (2006.01)
*H05K 5/02*      (2006.01)

(52) U.S. Cl.
CPC ....... *H05K 7/20163* (2013.01); *H05K 5/0256* (2013.01); *H05K 7/20172* (2013.01); *H05K 7/20436* (2013.01)

(58) Field of Classification Search
CPC ............. H05K 7/20154; H05K 7/2049; H05K 5/0256; G02B 6/3814
See application file for complete search history.

(56) References Cited

U.S. PATENT DOCUMENTS

| | | | |
|---|---|---|---|
| 2009/0296351 A1 | 12/2009 | Oki et al. | |
| 2017/0077643 A1* | 3/2017 | Zbinden | ............... G02B 6/4268 |
| 2018/0034492 A1* | 2/2018 | Edgren | ................... H04B 1/38 |
| 2018/0199468 A1* | 7/2018 | Hall, III | ............... G02B 6/4269 |
| 2020/0015386 A1* | 1/2020 | Gupta | ................ H05K 7/20172 |

FOREIGN PATENT DOCUMENTS

| | | |
|---|---|---|
| JP | 2009-152428 A | 7/2009 |
| JP | 2011-181731 A | 9/2011 |
| WO | 2011/109501 A2 | 9/2011 |

* cited by examiner

*Primary Examiner* — Mukundbhai G Patel
(74) *Attorney, Agent, or Firm* — Fujitsu Patent Center

(57) ABSTRACT

An information processing device includes a board, a receiver that includes a top wall facing the board, the receiver to allow a coupling device to be inserted into a space between the board and the top wall, a movable part provided in the top wall, the movable part to be movable in a direction facing the board, the movable part having a contact portion to be in contact with a top surface of the coupling device, an elastic part that has elasticity provided at the movable part, the elastic part urging the movable part toward the board, a heat sink thermally coupled to the movable part through the elastic part, a housing positioned over a side opposite the board relative to the heat sink, the housing having a facing wall facing the heat sink, and a fan to supply wind to the heat sink along the facing wall.

9 Claims, 9 Drawing Sheets

FIG. 3
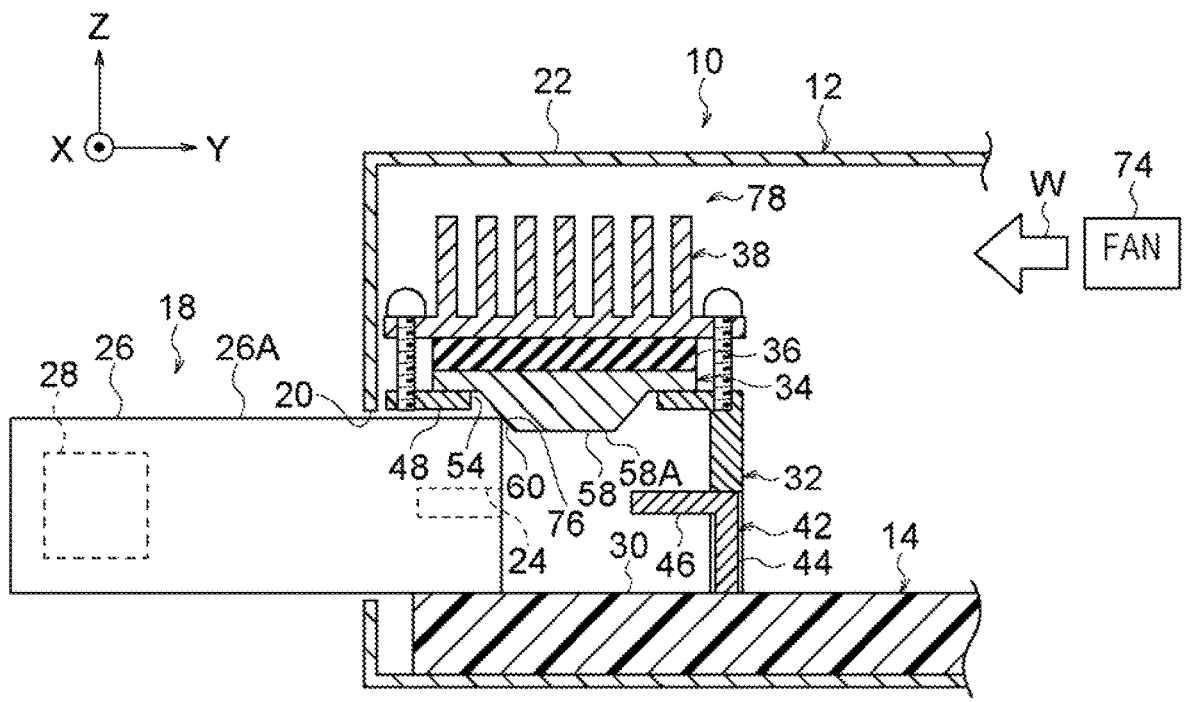
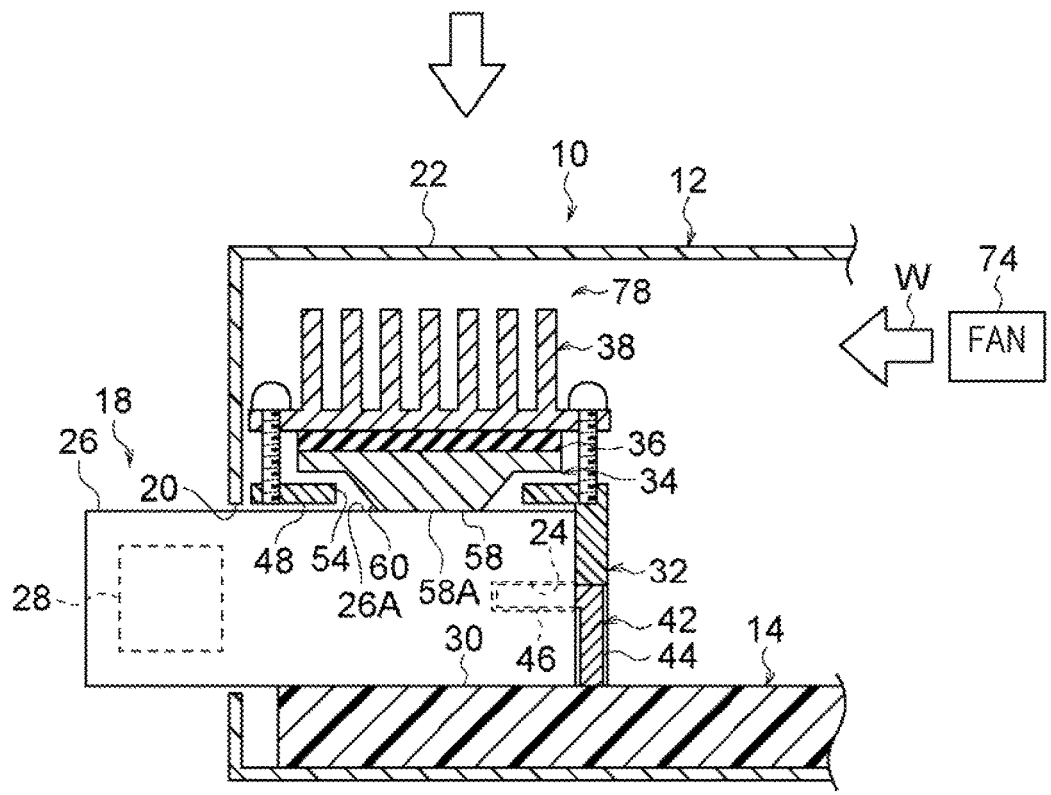

US 11,032,936 B2

INFORMATION PROCESSING DEVICE AND BOARD DEVICE

CROSS-REFERENCE TO RELATED APPLICATION

This application is based upon and claims the benefit of priority of the prior Japanese Patent Application No. 2018-217700, filed on Nov. 20, 2018, the entire contents of which are incorporated herein by reference.

FIELD

The technique discussed herein relates to an information processing device and a board device.

BACKGROUND

Examples of an information processing device include, for example, an information processing device that includes a board, a heat sink, and an urging unit. The heat sink is disposed above the board and movable in a direction facing the board. The urging unit urges the heat sink toward the board (see, for example, Japanese Laid-open Patent Publication No. 2009-152428). In this information processing device, when a coupling unit is inserted into a space between the board and the heat sink, the heat sink is urged by the urging unit so as to be moved toward the board and is thermally coupled to the coupling unit.

Japanese Laid-open Patent Publication No. 2011-181731 is also an example of the related art.

SUMMARY

According to an aspect of the embodiments, an information processing device includes a board, a receiver that includes a top wall facing the board, the receiver configured to allow a coupling device to be inserted into a space between the board and the top wall, a movable part provided in the top wall, the movable part configured to be movable in a direction facing the board, the movable part having a contact portion configured to be in contact with a top surface of the coupling device, an elastic part that has elasticity provided at the movable part, the elastic part urging the movable part toward the board, a heat sink thermally coupled to the movable part through the elastic part, a housing positioned over a side opposite the board relative to the heat sink, the housing having a facing wall facing the heat sink, and a fan configured to supply wind to the heat sink along the facing wall.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 illustrates how a coupling unit is inserted into a receiving member illustrated in FIG. 1;

DESCRIPTION OF EMBODIMENTS

In the information processing device described above, it is assumed that an upper wall portion of a housing faces the heat sink from the upper side of the heat sink. With such a structure, when the heat sink moves toward the board due to insertion of the coupling unit into the space between the board and the heat sink, the size of a gap between the upper wall portion of the housing and the heat sink increases in the up-down direction. This facilitates, when wind is supplied from the fan to the heat sink along the upper wall portion, flowing of the wind into the gap between the upper wall portion of the housing and the heat sink. Thus, the volume of air supplied to the heat sink may be reduced, and accordingly, the cooling performance of the heat sink may be degraded.

First Embodiment

Initially, a first embodiment of a technique for ensuring cooling performance of a heat sink disclosed herein is described.

Figure 1:
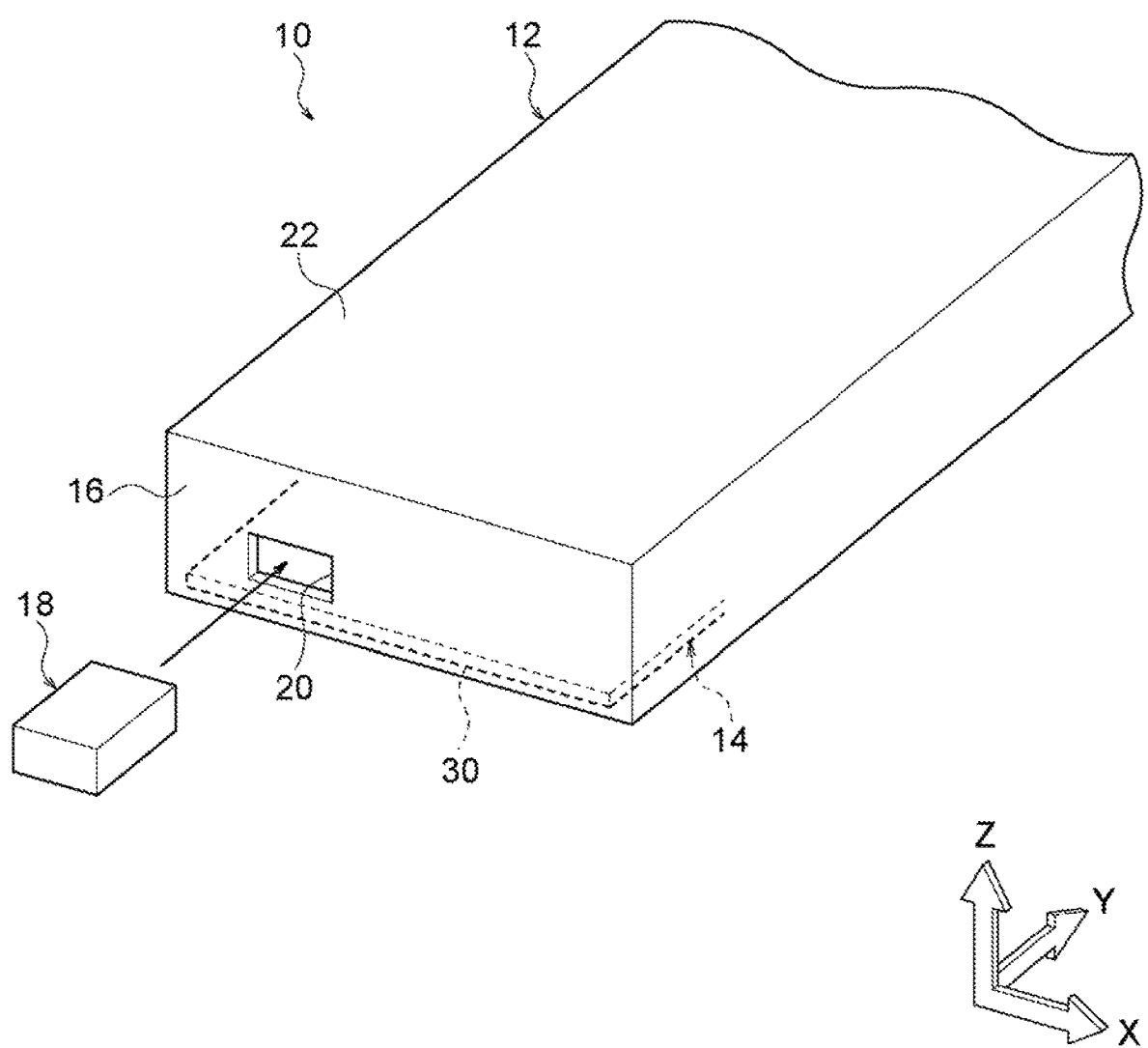
FIG. 1 is a perspective view of an information processing device according to a first embodiment.

An information processing device 10 according to the first embodiment illustrated in FIG. 1 is, for example, a server. This information processing device 10 includes a housing 12 and a board unit 14.

In the drawings, an arrow X indicates the width direction of the information processing device 10, an arrow Y indicates the depth direction of the information processing device 10, and an arrow Z indicates the height direction of the information processing device 10. The height direction of the information processing device 10 may be coincident with the vertical direction or the horizontal direction.

The housing 12 has a flat box shape and houses the board unit 14 therein. For example, an insertion port 20 into which a coupling unit 18 is inserted is formed in a front wall portion 16 of the housing 12. The housing 12 has an upper wall portion 22 positioned above the board unit 14. The upper wall portion 22 is an example of a "facing wall portion".

Figure 2:
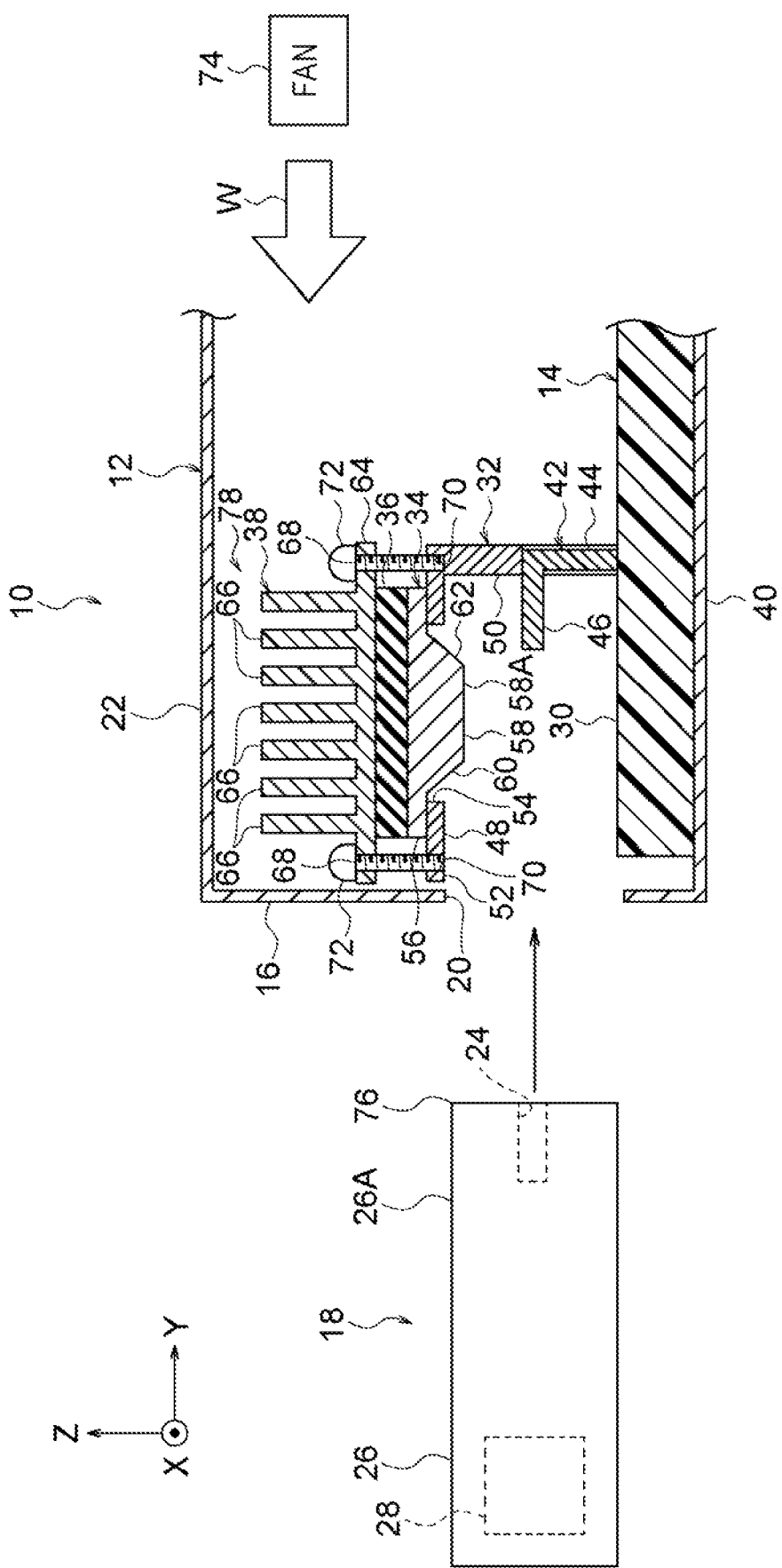
FIG. 2 is an enlarged longitudinal sectional view of a main part of the information processing device illustrated in FIG. 1.

The coupling unit 18 is, for example, an optical connector for coupling a plurality of servers through optical cables. As illustrated in FIG. 2, the coupling unit 18 has a coupling hole 24. The coupling hole 24 is open toward the front of the coupling unit 18 and extends in the front-rear direction of the coupling unit 18.

The coupling unit 18 includes a cover 26 and a heating element 28. The cover 26 is formed of a metal and has a box shape. The heating element 28 is housed in the cover 26. The heating element 28 is, for example, a photoelectric transducer and is thermally coupled to the cover 26. The term "thermally coupled" means coupling through a member having heat transferring property such that heat is able to be transferred.

The board unit 14 includes a board 30, a receiving member (receiver) 32, a movable member 34, a thermally conductive member 36, and a heat sink 38. In the following description, the up-down direction of the board 30, the receiving member 32, the movable member 34, the thermally conductive member 36, and the heat sink 38 corresponds to the height direction of the information processing device 10.

The board 30 is disposed along a lower wall portion 40 of the housing 12. Coupling terminals 42 being connector terminals are coupled to the board 30. The coupling terminals 42 each include a base portion 44 extending upward from the board 30 and a distal end portion 46 extending from an upper end portion of the base portion 44 toward the insertion port 20. The distal end portion 46 of the coupling terminal 42 is formed at a position to be inserted into the coupling hole 24 of the coupling unit 18 when the coupling unit 18 is inserted into the receiving member 32.

The receiving member 32 being a connector casing is provided on the board 30. The receiving member 32 has a top wall portion 48 and an upright wall portion 50. The upright wall portion 50 extends upward from the board 30. The top wall portion 48 extends from an upper end portion of the upright wall portion 50 toward the front wall portion 16 of the housing 12. The top wall portion 48 is positioned above the board 30 so as to face the board 30.

A space between the top wall portion 48 and the board 30 is an insertion space into which the coupling unit 18 is inserted along the board 30. The base portion 44 of the coupling terminal 42 is supported by the upright wall portion 50. The distal end portion 46 of the coupling terminal 42 projects from the upright wall portion 50 toward the inside of the receiving member 32.

Furthermore, the receiving member 32 has a pair of side wall portions (not illustrated). The side wall portions are formed at both end portions of the top wall portion 48 in the width direction (X direction). The side wall portions and a lower end portion of the upright wall portion 50 are secured to the board 30. A coupling port 52 open toward the insertion port 20 is formed on the side opposite the upright wall portion 50 in the receiving member 32. The coupling port 52 faces the insertion port 20. An opening 54 is formed in the top wall portion 48 so as to penetrate through the top wall portion 48 in the thickness direction (Z direction).

The movable member (movable part) 34 is provided in the top wall portion 48 of the receiving member 32 and movable in a direction facing the board 30 (Z direction). The movable member 34 is formed of a material having a good thermal conductivity and has a main body portion 56 and a projecting portion 58. The main body portion 56 has a flat plate shape. The main body portion 56 is larger than the opening 54 in size and disposed on top of the top wall portion 48.

The projecting portion 58 is an example of a "contact portion" and projects from the main body portion 56 toward the board 30. The projecting portion 58 is smaller than the opening 54 in size and inserted into the opening 54. When the main body portion 56 is superposed on the top wall portion 48, the projecting portion 58 projects, relative to the top wall portion 48, toward the board 30.

The cover 26 of the coupling unit 18 has a top surface 26A following the shape of the top wall portion 48. The projecting portion 58 is formed at such a position that, when the coupling unit 18 is inserted into the receiving member 32, the projecting portion 58 is brought into contact with the top surface 26A of the cover 26. A distal end surface 58A (lower end surface) of the projecting portion 58 is a flat surface following the shape of the top surface 26A of the cover 26.

The projecting portion 58 has a tapered shape that reduces toward the board 30 in dimension in the depth direction of the receiving member 32 (Y direction). That is, a side surface 60 of the projecting portion 58 on the insertion port 20 side is an inclined surface facing both the board 30 and the insertion port 20, and a side surface 62 of the projecting portion 58 on the side opposite the insertion port 20 side is an inclined surface facing both the board 30 and the side opposite the insertion port 20.

The thermally conductive member 36 is an example of an "urging unit (elastic part)" and has an elasticity. The thermally conductive member 36 is formed of a material having a good thermal conductivity. The thermally conductive member 36 has a sheet shape and is stacked on the movable member 34. This stacking of the thermally conductive member 36 exemplifies providing of the thermally conductive member 36 at the movable member 34. The thermally conductive member 36 is, for example, a thermal sheet. The thermally conductive member 36 is interposed between the movable member 34 and the heat sink 38 and urges the movable member 34 toward the board 30.

The heat sink 38 includes a plate-shaped portion 64 and a plurality of protruding portions 66. The plate-shaped portion 64 is stacked on the movable member 34 with the thermally conductive member 36 interposed therebetween. That is, the plate-shaped portion 64 is stacked on the thermally conductive member 36. The heat sink 38 is, when the plate-shaped portion 64 is stacked on the movable member 34 with the thermally conductive member 36 interposed therebetween, thermally coupled to the movable member 34 through the thermally conductive member 36. The protruding portions 66 extend from the plate-shaped portion 64 toward the upper side of the heat sink 38. The heat sink 38 is formed of a material having a good thermal conductivity.

The main body portion 56 of the movable member 34 and the thermally conductive member 36 described above are smaller in size than the top wall portion 48 of the receiving member 32, and the plate-shaped portion 64 is substantially the same in size as the top wall portion 48. A portion of the plate-shaped portion 64 near or at the outer periphery projects relative to the main body portion 56 of the movable member 34 and the thermally conductive member 36 in directions in which the top wall portion 48 extends (X and Y directions). A plurality of through holes 68 are formed in this outer peripheral portion of the plate-shaped portion 64. The through holes 68 penetrate through the plate-shaped portion 64 in the thickness direction (Z direction).

A plurality of threaded holes 70 are formed in the top wall portion 48 of the receiving member 32 described above. The axial direction of the threaded holes 70 are coincident with the thickness direction of the top wall portion 48. The threaded holes 70 are formed at positions aligned with the respective through holes 68 described above. When screws 72 are inserted into the respective threaded holes 70 and the tips of the screws 72 are fastened to the threaded holes 70, the heat sink 38 is secured to the top wall portion 48.

When the heat sink 38 is secured to the top wall portion 48, the heat sink 38 is secured to the board 30. The upper wall portion 22 of the housing 12 described above is positioned on the side opposite the board 30 relative to the heat sink 38 and faces the heat sink 38.

The information processing device 10 also includes a fan 74. The fan 74 is disposed, for example, on the side opposite the insertion port 20 relative to the heat sink 38. The fan 74 is operated so as to supply wind W to the heat sink 38 along the upper wall portion 22. A discharge port through which the wind W is discharged may be formed in the front wall portion 16 of the housing 12.

Next, cooling operations, functions, and effects of the information processing device 10 according to the first embodiment are described.

As illustrated in FIG. 3, when the coupling unit 18 is inserted into the insertion port 20, an edge portion 76 on the front side of the coupling unit 18 is brought into contact with the side surface 60 of the projecting portion 58 on the insertion port 20 side. Since the side surface 60 is the inclined surface facing the insertion port 20 and the board 30, an upward pressing force is applied to the movable member 34 when the edge portion 76 presses the side surface 60.

When the movable member 34 is pressed upward resisting the elastic force of the thermally conductive member 36, the coupling unit 18 is inserted between the movable member 34 and the board 30. When the coupling unit 18 is inserted to a rear portion of the receiving member 32, the distal end portion 46 of the coupling terminal 42 is inserted into the coupling hole 24 of the coupling unit 18. Thus, the coupling hole 24 and the coupling terminal 42 are coupled to each other. In this way, the coupling unit 18 and the information processing device 10 become able to communicate with each other.

Furthermore, when the coupling unit 18 is inserted into the receiving member 32, the movable member 34 is urged by the thermally conductive member 36. This causes the distal end surface 58A formed on the projecting portion 58 of the movable member 34 to be pressed against the top surface 26A formed on the cover 26 of the coupling unit 18. Thus, the distal end surface 58A of the projecting portion 58 is brought into surface contact with the top surface 26A of the cover 26.

In this state, the heating element 28 of the coupling unit 18 is thermally coupled to the heat sink 38 through the cover 26, the movable member 34, and the thermally conductive member 36. Thus, the heat of the heating element 28 is transferred to the heat sink 38. Furthermore, the wind W is supplied from the fan 74 to the heat sink 38 along the upper wall portion 22. Thus, the heat of the heat sink 38 is dissipated. As a result of the above-described operation, the heating element 28 is cooled.

Here, in the information processing device 10 according to the first embodiment, the heat sink 38 is secured to the board 30 by being secured to the top wall portion 48 of the receiving member 32. Accordingly, even when the coupling unit 18 is inserted into the receiving member 32, the position of the heat sink 38 in the up-down direction is unchanged, and the dimension of the gap 78 between the upper wall portion 22 of the housing 12 and the heat sink 38 in the up-down direction is also unchanged.

Thus, for example, compared to the case where the size of the gap 78 is increased in the up-down direction due to a movement of the heat sink 38 toward the board 30 when the coupling unit 18 is inserted into the receiving member 32, the likelihood of the wind W flowing into the gap 78 is able to be suppressed. Thus, the volume of air supplied to the heat sink 38 may be ensured, and accordingly, the cooling performance of the heat sink 38 may be ensured.

Furthermore, when the movable member 34 is urged by the thermally conductive member 36, the projecting portion 58 of the movable member 34 is brought into pressure contact with the top surface 26A formed on the cover 26 of the coupling unit 18. Thus, thermal resistance between the cover 26 and the movable member 34 is able to be reduced, and accordingly, heat may be efficiently transferred from the cover 26 to the movable member 34.

The heat sink 38 is stacked on the movable member 34 with the thermally conductive member 36 interposed therebetween. Thus, the contact area between the movable member 34 and the thermally conductive member 36 and the contact area between the heat sink 38 and the thermally conductive member 36 may be ensured. Thus, the thermal resistance between the movable member 34 and the thermally conductive member 36 and the thermal resistance between the heat sink 38 and the thermally conductive member 36 are able to be reduced. Accordingly, heat may be efficiently transferred from the movable member 34 to the heat sink 38.

Furthermore, the movable member 34 is able to be urged toward the board 30 by the thermally conductive member 36, which allows the movable member 34 and the heat sink 38 to be thermally coupled. Thus, for example, compared to the case where a member that urges the movable member 34 toward the board 30 and a member that thermally couples the movable member 34 and the heat sink 38 to each other are separately provided, the structure may be simplified.

Furthermore, the projecting portion 58 projects toward the board 30 relative to the top wall portion 48, and, when the coupling unit 18 is inserted into the receiving member 32, the projecting portion 58 is brought into contact with the top surface 26A of the coupling unit 18. Thus, it is not required that a special structure such as a cam mechanism for pressing the movable member 34 upward be provided in the coupling unit 18. Accordingly, an increase in cost may be suppressed.

Next, variants of the first embodiment are described.

Although the information processing device 10 is, as an example, a server according to the first embodiment, the information processing device 10 may be a different device from a server.

Although the coupling unit 18 is, as an example, an optical connector according to the first embodiment, the coupling unit 18 may be another device than an optical connector.

According to the first embodiment, the sheet-shaped thermally conductive member 36 is used to thermally couple the movable member 34 and the heat sink 38 to each other and to urge the movable member 34 toward the board 30. However, the thermally conductive member 36 may have another shape than a sheet shape.

According to the first embodiment, the fan 74 is disposed on the side opposite the insertion port 20 relative to the heat sink 38, and the wind W fed from the fan 74 is supplied to the heat sink 38. However, for example, when the heat sink 38 is disposed away from the insertion port 20, the fan 74 may be disposed between the heat sink 38 and the insertion port 20. In this case, the wind W may be supplied to the heat sink 38 when air is sucked by the fan 74 so as to form a flow of the wind W.

According to the first embodiment, the side surface 60 of the projecting portion 58 on the insertion port 20 side is the inclined surface facing both the board 30 and the insertion port 20. However, the side surface 60 of the projecting portion 58 on the insertion port 20 side may be an upright surface extending in the direction normal to the board 30, and an inclined surface may be formed on the edge portion 76 on an upper front side of the coupling unit 18. The movable member 34 may be pressed upward resisting the elastic force of the thermally conductive member 36 when the side surface 60 of the projecting portion 58 on the insertion port 20 side is brought into contact with the inclined surface formed on the edge portion 76 on the upper front side of the coupling unit 18.

Second Embodiment

Next, a second embodiment of the technique disclosed herein is described.

Figure 4:
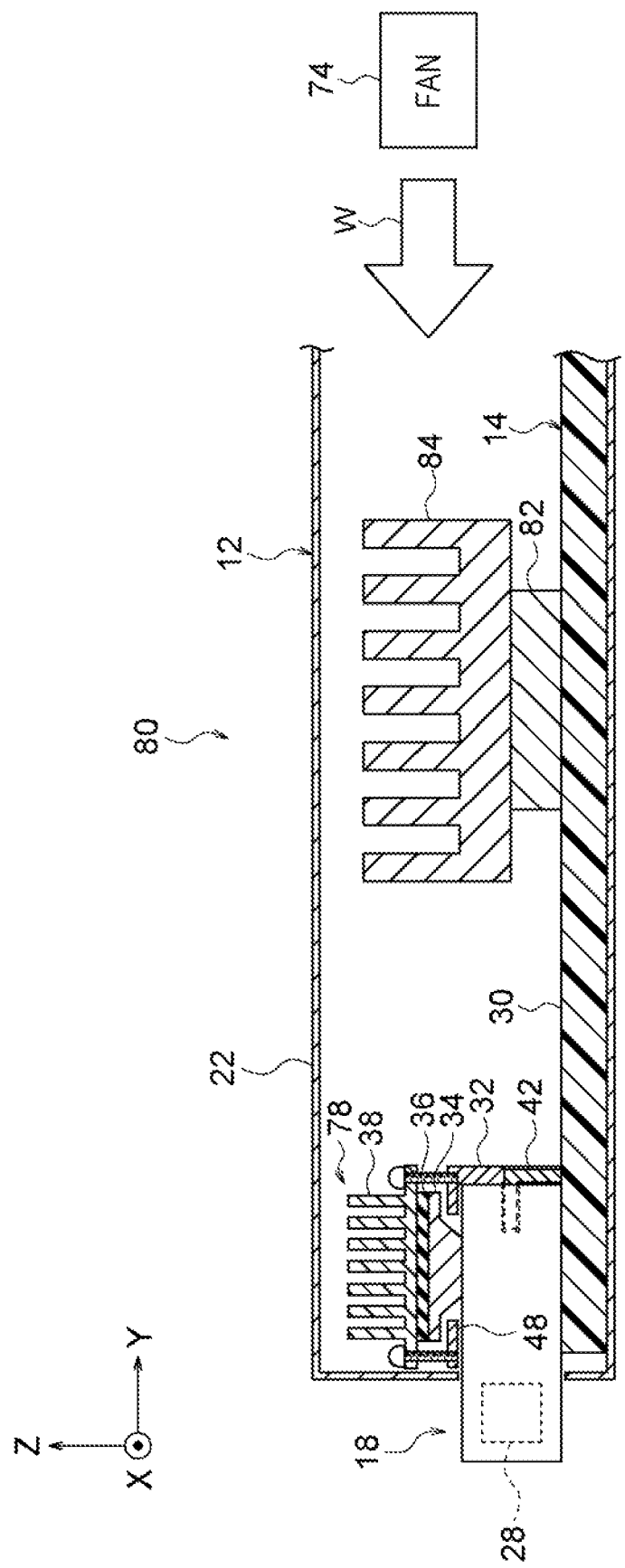
FIG. 4 is an enlarged longitudinal sectional view of a main part of an information processing device according to a second embodiment.
Figure 5:
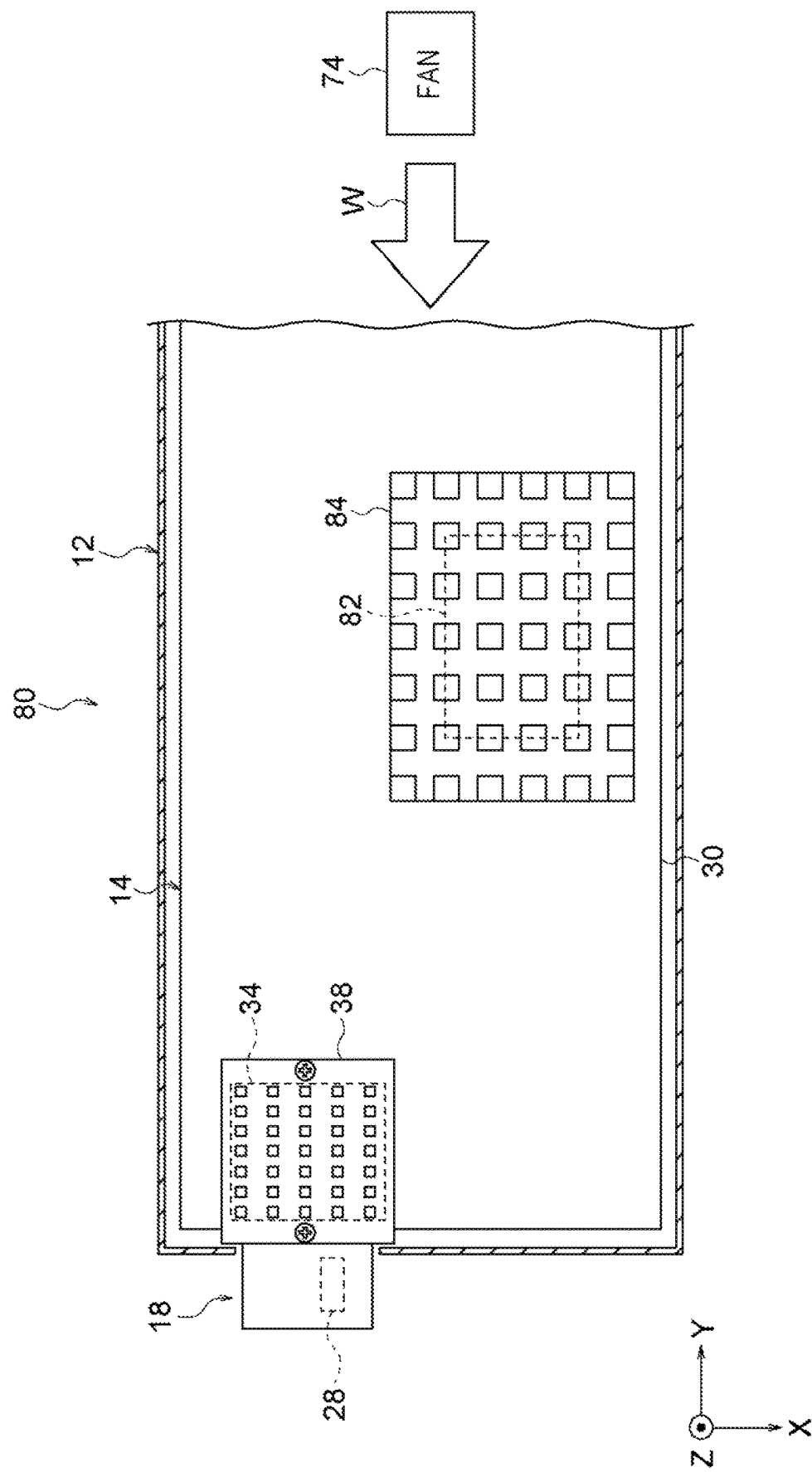
FIG. 5 is an enlarged plan view of the main part of the information processing device illustrated in FIG. 4.

The structure of an information processing device 80 according to the second embodiment illustrated in FIGS. 4 and 5 is changed from the structure of the information processing device 10 (see FIG. 2) according to the first embodiment as follows.

That is, in the information processing device 80 according to the second embodiment, a heat generating component 82 is disposed on the board 30. This heat generating component 82 is, for example, a graphics processing unit (GPU). A second heat sink 84 is disposed on the heat generating component 82.

The heat generating component 82 and the second heat sink 84 are positioned upstream of the heat sink 38 in the direction of the flow of the wind W (Y direction). Furthermore, the heat sink 38 is disposed so as to be displaced relative to the heat generating component 82 and the second heat sink 84 in the direction perpendicular to the wind W flowing direction (X direction) in plan view of the board 30.

The information processing device 80 according to the second embodiment suppresses supply, to the heat sink 38, of the wind having passed through the heat generating component 82 and the second heat sink 84 out of the wind W fed from the fan 74, and the wind W fed from the fan 74 is directly supplied to the heat sink 38. Thus, the cooling performance of the heat sink 38 may be ensured.

Any of the variants of the first embodiment may be applied to the second embodiment.

Third Embodiment

Next, a third embodiment of the technique disclosed herein is described.

Figure 6:
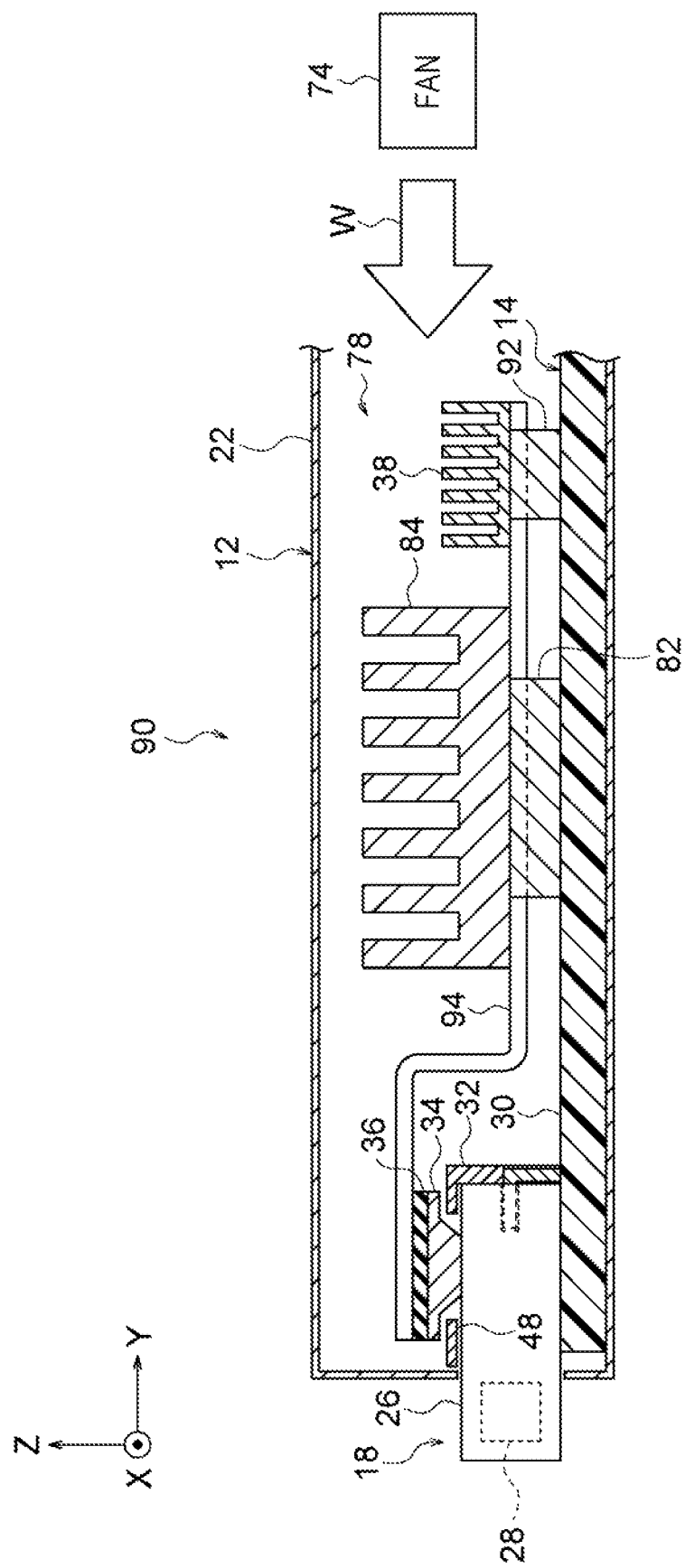
FIG. 6 is an enlarged longitudinal sectional view of a main part of an information processing device according to a third embodiment.
Figure 7:
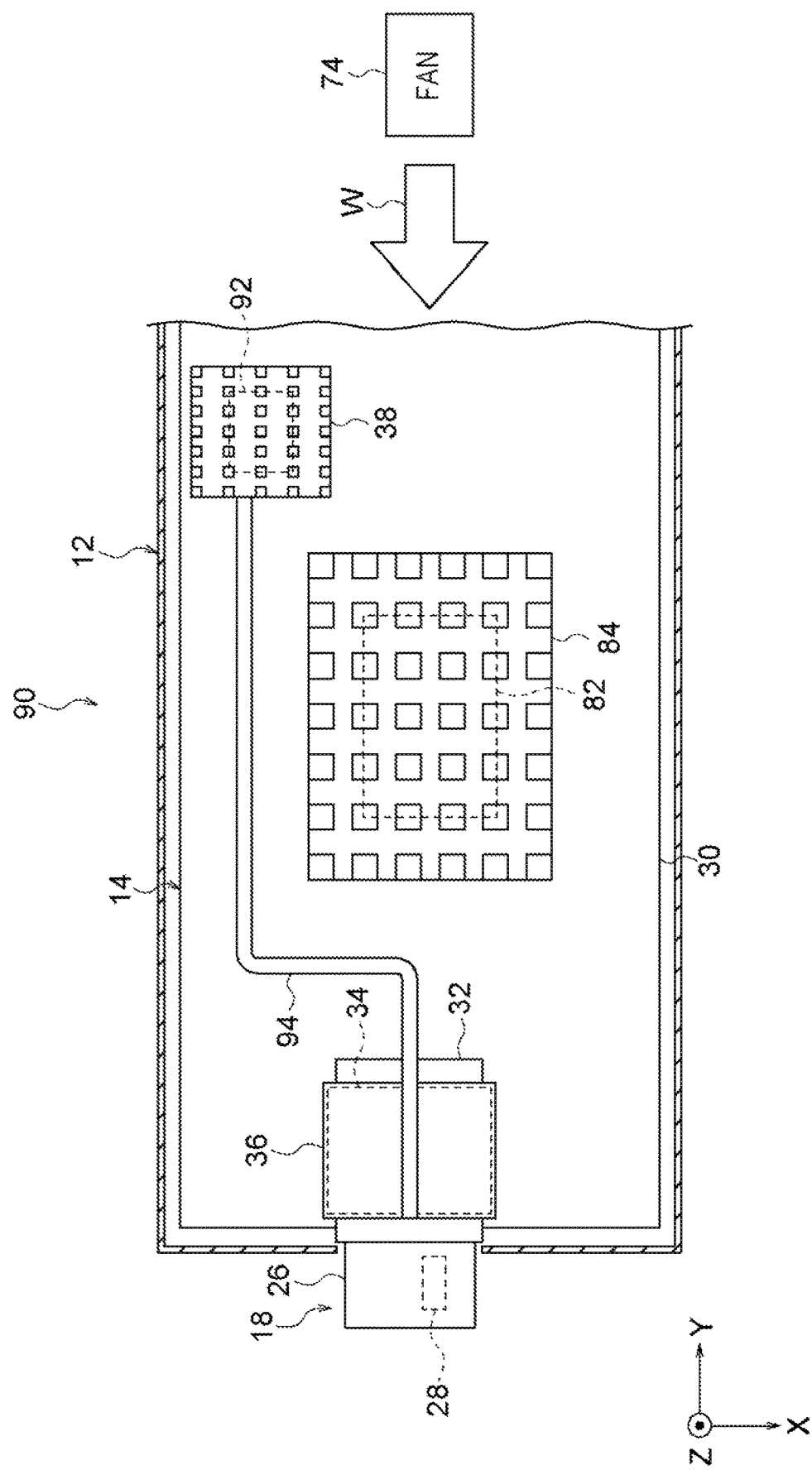
FIG. 7 is an enlarged plan view of the main part of the information processing device illustrated in FIG. 6.

The structure of an information processing device 90 according to the third embodiment illustrated in FIGS. 6 and 7 is changed from the structure of the information processing device 80 (see FIGS. 4 and 5) according to the second embodiment as follows.

That is, in the information processing device 90 according to the third embodiment, the heat generating component 82 and the second heat sink 84 are positioned upstream of the movable member 34 and the thermally conductive member 36 in the wind W flowing direction (Y direction). The heat generating component 82 and the second heat sink 84 are disposed so as to overlap the movable member 34 and the thermally conductive member 36 in the direction perpendicular to the wind W flowing direction (X direction) in plan view of the board 30.

The heat sink 38 is positioned upstream of the heat generating component 82 and the second heat sink 84 in the wind W flowing direction. The heat sink 38 is secured to the board 30 by a securing member 92. The thermally conductive member 36 and the heat sink 38 are thermally coupled to each other through a heat transfer member 94. The heat transfer member 94 is, for example, a heat pipe.

In the information processing device 90 according to the third embodiment, the heat sink 38 is secured to the board 30 by using the securing member 92. Accordingly, the position of the heat sink 38 in the up-down direction is unchanged, and the dimension of the gap 78 between the upper wall portion 22 of the housing 12 and the heat sink 38 in the up-down direction is also unchanged. Accordingly, as is the case with the first embodiment, the likelihood of the wind W from the fan 74 flowing into the gap 78 is able to be suppressed. Thus, the volume of air supplied to the heat sink 38 may be ensured, and accordingly, the cooling performance of the heat sink 38 may be ensured.

The heat sink 38 is positioned upstream of the heat generating component 82 and the second heat sink 84 in the wind W flowing direction. This suppresses supply, to the heat sink 38, of the wind having passed through the heat generating component 82 and the second heat sink 84 out of the wind W fed from the fan 74, and the wind W fed from the fan 74 is directly supplied to the heat sink 38. Thus, the cooling performance of the heat sink 38 may be ensured.

The thermally conductive member 36 and the heat sink 38 are thermally coupled to each other through the heat transfer member 94. Accordingly, heat of the heating element 28 is able to be transferred to the heat sink 38 through the cover 26, the movable member 34, the thermally conductive member 36, and the heat transfer member 94. Thus, even when the heat sink 38 is disposed away from the movable member 34, the heating element 28 is able to be cooled.

Since the heat transfer member 94 is used to thermally couple the thermally conductive member 36 and the heat sink 38 to each other, the degree of freedom in the arrangement of the heat sink 38 may be increased.

Any of the variants of the first embodiment may be applied to the third embodiment.

Fourth Embodiment

Next, a fourth embodiment of the technique disclosed herein is described.

Figure 8:
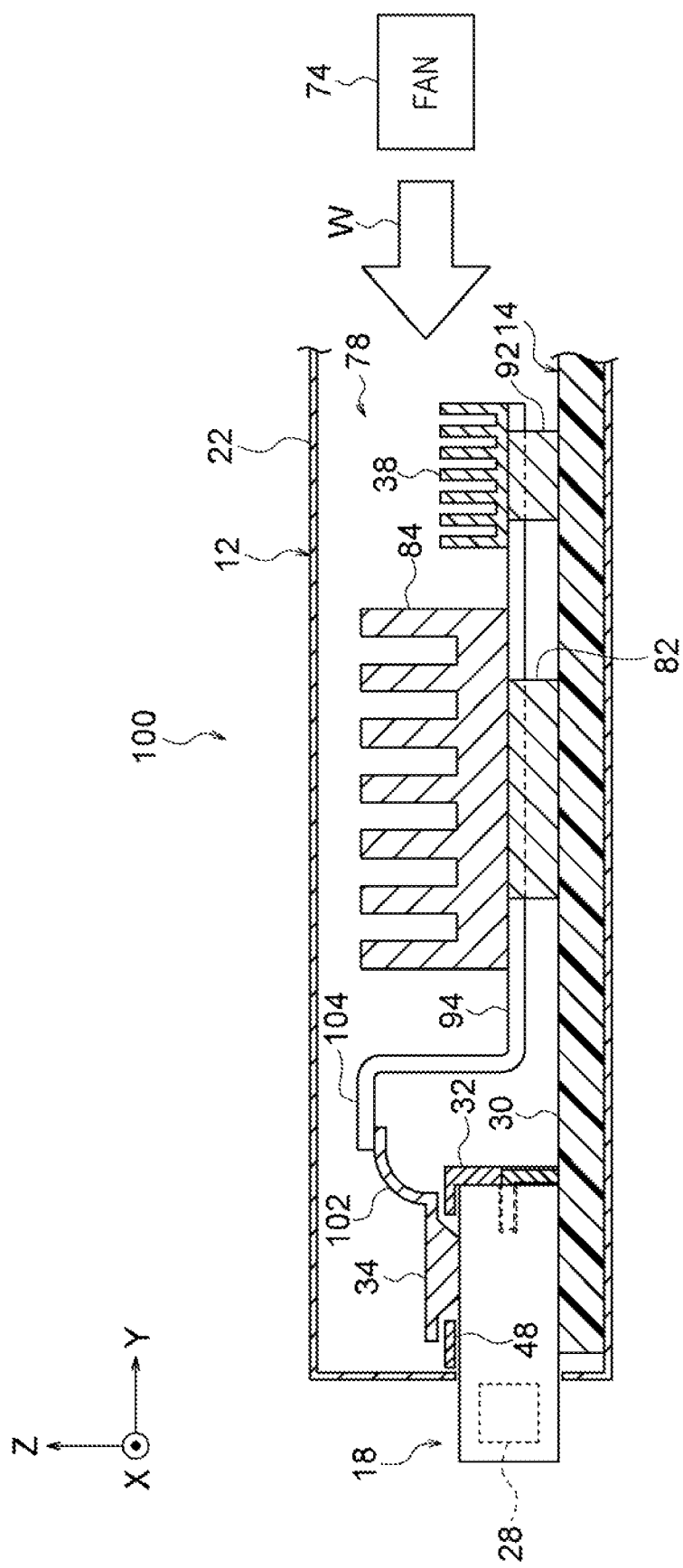
FIG. 8 is an enlarged longitudinal sectional view of a main part of an information processing device according to a fourth embodiment.

The structure of an information processing device 100 according to the fourth embodiment illustrated in FIG. 8 is changed from the structure of the information processing device 90 (see FIGS. 6 and 7) according to the third embodiment as follows.

That is, in the information processing device 100 according to the fourth embodiment, the movable member 34 is provided with a thermally conductive piece 102. The thermally conductive piece 102 may be integrated with the movable member 34 or independently of the movable member 34. The thermally conductive piece 102 is an example of an "urging unit". The thermally conductive piece 102 extends from the movable member 34 and has elasticity.

A distal end portion of the thermally conductive piece 102 is in contact with a heat receiving portion 104 formed at one end of the heat transfer member 94. When the distal end portion of the thermally conductive piece 102 is in contact with the heat receiving portion 104, the thermally conductive piece 102 is elastically deformed. In this way, the movable member 34 is urged toward the board 30 by the thermally conductive piece 102. The movable member 34 is thermally coupled to the heat sink 38 through the thermally conductive piece 102 and the heat transfer member 94.

With the information processing device 100 according to the fourth embodiment, the movable member 34 is able to be urged toward the board 30 by the thermally conductive piece 102, and the movable member 34 and the heat transfer member 94 are able to be thermally coupled to each other through the thermally conductive piece 102. Thus, for example, compared to the case where a member that urges the movable member 34 toward the board 30 and a member that thermally couples the movable member 34 and the heat transfer member 94 to each other are separately provided, the structure may be simplified.

Any of the variants of the first embodiment may be applied to the fourth embodiment.

Fifth Embodiment

Next, a fifth embodiment of the technique disclosed herein is described.

Figure 9:
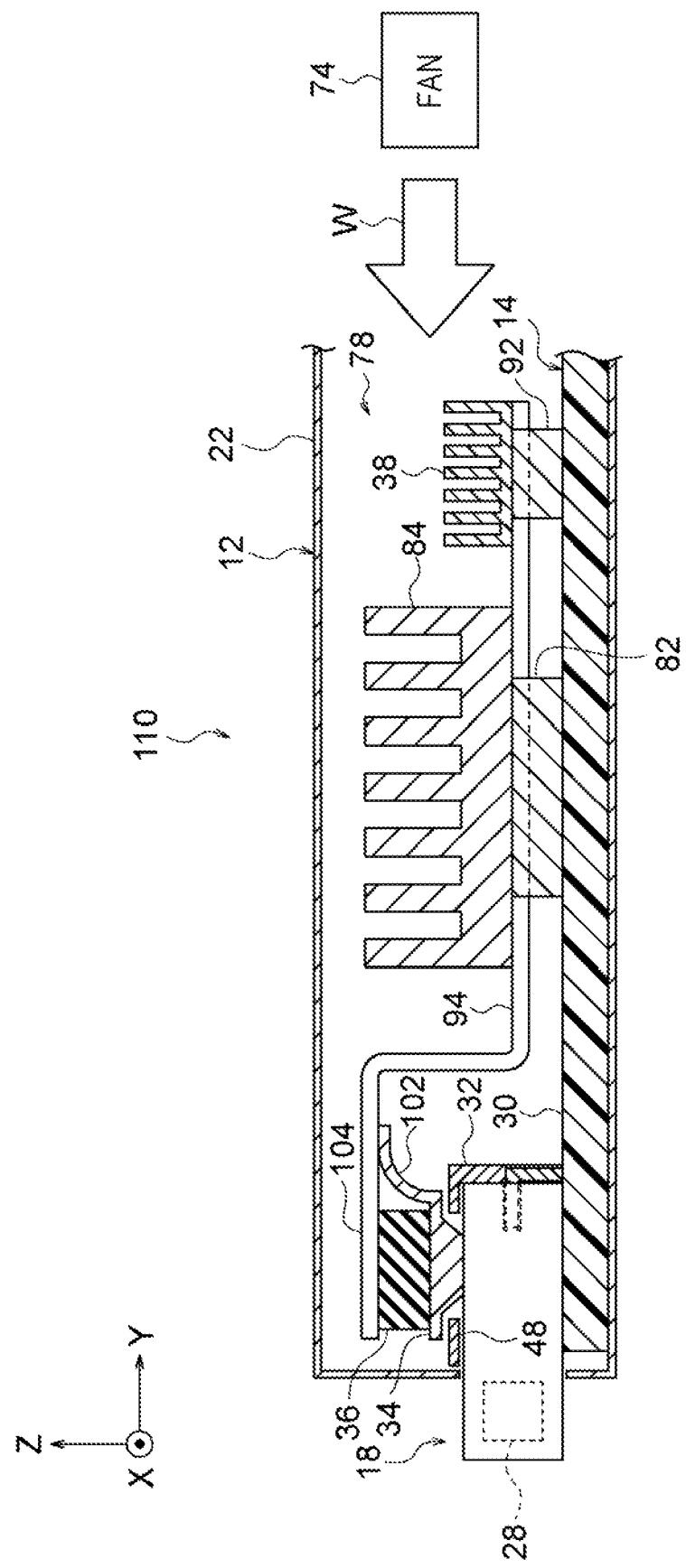
FIG. 9 is an enlarged longitudinal sectional view of a main part of an information processing device according to a fifth embodiment.

An information processing device 110 according to the fifth embodiment illustrated in FIG. 9 has a structure in which the information processing device 90 according to the third embodiment (see FIGS. 6 and 7) and the information processing device 100 according to the fourth embodiment (see FIG. 8) are generally combined.

That is, in the information processing device 110 according to the fifth embodiment, the heat receiving portion 104 formed at the one end of the heat transfer member 94 extends to a region above the movable member 34. The thermally conductive member 36 is interposed between the heat receiving portion 104 of the heat transfer member 94 and the movable member 34. The distal end portion of the thermally conductive piece 102 is in contact with the heat receiving portion 104 of the heat transfer member 94.

Thus, the movable member 34 is urged toward the board 30 by the thermally conductive member 36 and the thermally conductive piece 102. The movable member 34 is thermally coupled to the heat transfer member 94 through the thermally conductive member 36 and the thermally conductive piece 102.

In the information processing device 110 according to the fifth embodiment, the movable member 34 is thermally coupled to the heat transfer member 94 through two routes, that is, through the thermally conductive member 36 and the thermally conductive piece 102. Thus, for example, compared to the case where the movable member 34 is thermally coupled to the heat transfer member 94 only through a single route, that is through either the thermally conductive member 36 or the thermally conductive piece 102, heat transfer efficiency from the movable member 34 to the heat transfer member 94 may be improved.

Any of the variants of the first embodiment may be applied to the fifth embodiment.

Although the first to fifth embodiments of the technique disclosed herein have been described, the technique disclosed herein is not limited to the above description. Of course, in addition to the above description, the technique disclosed herein is able to be varied in a variety of manners and embodied without departing from the gist thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing device comprising:
a board;
a receiver that includes a top wall facing the board, the receiver configured to allow a coupling device to be inserted into a space between the board and the top wall;
a movable part provided in the top wall, the movable part configured to be movable in a direction facing the board, the movable part having a contact portion configured to be in contact with a top surface of the coupling device;
an elastic part that has elasticity provided at the movable part, the elastic part urging the movable part toward the board;
a housing positioned over a side opposite the board relative to the heat sink, the housing having a facing wall facing the heat sink;
a fan configured to supply wind to the heat sink along the facing wall;
a heat generator, separate from the coupling device, disposed over the board and positioned upstream of the movable part in a wind flowing direction;
a heat transfer member thermally coupled to the elastic part and the heat generator;
a first heat sink thermally coupled to the heat transfer member and the heat generator; and
a second heat sink thermally coupled to the heat transfer member.

2. The information processing device according to claim 1, wherein the first heat sink is positioned upstream of the second heat sink in a wind flowing direction.

3. The information processing device according to claim 1, wherein the heat generator is positioned upstream of the second heat sink in a wind flowing direction, and the second heat sink is disposed relative to the heat generator in a direction perpendicular to the wind flowing direction in plan view of the board.

4. The information processing device according to claim 1, wherein the first heat sink is positioned on a top surface of the heat generator.

5. The information processing device according to claim 4, wherein the heat transfer member is a heat pipe.

6. The information processing device according to claim 1, wherein the contact portion is a projecting portion that projects toward the board relative to the top wall.

7. A board device comprising:
a board;
a receiver that includes a top wall facing the board, the receiver configured to allow a coupling device to be inserted into a space between the board and the top wall;
a movable part provided in the top wall, the movable part configured to be movable in a direction facing the board, the movable part having a contact portion configured to be in contact with a top surface of the coupling device;
an elastic part that has elasticity provided at the movable part, the elastic part urging the movable part toward the board;
a heat generator, separate from the coupling device, disposed over the board and positioned upstream of the movable part in a wind flowing direction;
a heat transfer member thermally coupled to the elastic part and the heat generator;
a first heat sink thermally coupled to the heat transfer member and the heat generator; and
a second heat sink thermally coupled to the heat transfer member.

8. The board device according to claim 7, wherein the first heat sink is positioned upstream of the second heat sink in a wind flowing direction.

9. The board device according to claim 7, wherein the contact portion is a projecting portion that projects toward the board relative to the top wall.

* * * * *